United States Patent
Fujita

(10) Patent No.: US 10,308,546 B2
(45) Date of Patent: Jun. 4, 2019

(54) MULTILAYER CERAMIC SUBSTRATE AND ELECTRONIC COMPONENT

(71) Applicant: Murata Manufacturing Co., Ltd., Nagaokakyo-shi, Kyoto-fu (JP)

(72) Inventor: Seiji Fujita, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/987,416

(22) Filed: May 23, 2018

(65) Prior Publication Data

US 2018/0273420 A1 Sep. 27, 2018

Related U.S. Application Data

(63) Continuation of application No. PCT/JP2016/078411, filed on Sep. 27, 2016.

(30) Foreign Application Priority Data

Nov. 30, 2015 (JP) .................................. 2015-233355

(51) Int. Cl.
B32B 15/04 (2006.01)
B32B 17/06 (2006.01)
(Continued)

(52) U.S. Cl.
CPC ............ *C03C 14/004* (2013.01); *B32B 18/00* (2013.01); *C03C 3/064* (2013.01); *C03C 3/091* (2013.01);
(Continued)

(58) Field of Classification Search
USPC .................................................. 428/428, 688
See application file for complete search history.

(56) References Cited

U.S. PATENT DOCUMENTS 5,827,605 A * 10/1998 Nishide .................. B32B 17/00
428/209
5,955,938 A * 9/1999 Fukaya .................... H01L 28/24
257/E21.006
(Continued)

FOREIGN PATENT DOCUMENTS

JP 2003201170 A 7/2003
JP 2007073728 A 3/2007
(Continued)

OTHER PUBLICATIONS

International Search Report issued in International Application No. PCT/JP2016/078411, dated Dec. 20, 2016.
(Continued)

*Primary Examiner* — Lauren R Colgan
(74) *Attorney, Agent, or Firm* — Arent Fox LLP

(57) ABSTRACT

A multilayer ceramic substrate that includes a laminated structure including a surface layer portion located on a surface of the laminated structure and an inner layer portion located on the inner side of the laminated structure, the surface layer portion including a first layer adjacent to the inner layer portion, the inner layer portion including a second layer adjacent to the first layer. The thermal expansion coefficient of the first layer is lower than the thermal expansion coefficient of the second layer, a first glass contained in the first layer and a second glass contained in the second layer each contain 40% or more by weight MO (where M represents at least one selected from the group consisting of Ca, Mg, Sr, and Ba), and the difference in softening points between the first glass and the second glass is 60° C. or lower.

17 Claims, 2 Drawing Sheets

(51) Int. Cl.

| | | |
|---|---|---|
| C03C 14/00 | (2006.01) | |
| H05K 3/46 | (2006.01) | |
| B32B 18/00 | (2006.01) | |
| C04B 35/78 | (2006.01) | |
| H05K 1/03 | (2006.01) | |
| C04B 35/117 | (2006.01) | |
| C03C 3/064 | (2006.01) | |
| C03C 3/091 | (2006.01) | |
| C03C 8/14 | (2006.01) | |
| H05K 1/02 | (2006.01) | |

(52) U.S. Cl.
CPC ............ *C03C 8/14* (2013.01); *C04B 35/117* (2013.01); *C04B 35/78* (2013.01); *H05K 1/0271* (2013.01); *H05K 1/0306* (2013.01); *H05K 1/0393* (2013.01); *H05K 3/46* (2013.01); *C04B 2235/3208* (2013.01); *C04B 2235/3427* (2013.01); *C04B 2235/365* (2013.01); *C04B 2235/5436* (2013.01); *C04B 2235/5445* (2013.01); *C04B 2235/9607* (2013.01); *C04B 2237/343* (2013.01); *C04B 2237/582* (2013.01); *H05K 3/4605* (2013.01); *H05K 2201/068* (2013.01)

(56) References Cited

U.S. PATENT DOCUMENTS

| | | | | |
|---|---|---|---|---|
| 6,414,247 | B1* | 7/2002 | Nakai | C03C 14/004 174/250 |
| 6,878,464 | B2* | 4/2005 | Moriya | C03C 14/004 257/E23.009 |
| 7,883,765 | B2 | 2/2011 | Sakamoto | |
| 8,491,834 | B2 | 7/2013 | Iida et al. | |
| 9,538,645 | B2 | 1/2017 | Kobuke et al. | |
| 2003/0113554 | A1* | 6/2003 | Umayahara | B32B 17/06 428/446 |
| 2003/0118842 | A1 | 6/2003 | Moriya et al. | |
| 2007/0224400 | A1* | 9/2007 | Meguro | H01L 21/4807 428/209 |
| 2009/0011249 | A1* | 1/2009 | Sakamoto | H05K 3/4629 428/428 |
| 2010/0151217 | A1 | 6/2010 | Kanada et al. | |
| 2011/0223399 | A1* | 9/2011 | Adachi | C04B 35/20 428/212 |
| 2011/0266036 | A1* | 11/2011 | Iida | B32B 18/00 174/255 |
| 2012/0267037 | A1* | 10/2012 | Kishida | B32B 18/00 156/89.12 |
| 2016/0088729 | A1 | 3/2016 | Kobuke et al. | |
| 2018/0072627 | A1* | 3/2018 | Kato | C04B 35/195 |

FOREIGN PATENT DOCUMENTS

| | | |
|---|---|---|
| JP | 2010147101 A | 7/2010 |
| JP | 2012167008 A | 9/2012 |
| JP | 2014236072 A | 12/2014 |
| WO | 2007142112 A1 | 12/2007 |
| WO | 2010084813 A1 | 7/2010 |

OTHER PUBLICATIONS

Written Opinion of the International Searching Authority issued in International Application No. PCT/JP2016/078411, dated Dec. 20, 2016.

\* cited by examiner

MULTILAYER CERAMIC SUBSTRATE AND ELECTRONIC COMPONENT

CROSS REFERENCE TO RELATED APPLICATIONS

The present application is a continuation of International application No. PCT/JP2016/078411, filed Sep. 27, 2016, which claims priority to Japanese Patent Application No. 2015-233355, filed Nov. 30, 2015, the entire contents of each of which are incorporated herein by reference.

FIELD OF THE INVENTION

The present invention relates to a multilayer ceramic substrate and an electronic component.

BACKGROUND OF THE INVENTION

In recent years, multilayer ceramic substrates including three-dimensionally arranged conductive leads have been widely used in applications for, for example, modules including electronic components such as semiconductor devices.

Patent Document 1 discloses a multilayer ceramic substrate including a laminated structure that includes an inner layer portion and surface layer portions that sandwich the inner layer portion in the laminating direction, letting the thermal expansion coefficient of the surface layer portions be $\alpha 1$ [ppmK$^{-1}$] and letting the thermal expansion coefficient of the inner layer portion be $\alpha 2$ [ppmK$^{-1}$], $0.3 \leq \alpha 2 - \alpha 1 \leq 1.5$, and the, inner layer portion including needle crystals deposited therein. Patent Document 2 discloses a multilayer ceramic substrate having a laminated structure including surface layer portions and an inner layer portion, in which thermal expansion coefficients of the surface layer portions are lower than a thermal expansion coefficient of the inner layer portion, the difference in the, thermal expansion coefficients between the surface layer portions and the inner layer portion is 1.0 ppmK$^{-1}$ or more, and the content of a component common to both a material contained in the surface layer portions and a material contained in the inner layer portion is 75% by weight or more.

Each of Patent Documents 1 and 2 that disclose the multilayer ceramic substrates says that the use of the surface layer portions each having a lower thermal expansion coefficient than the inner layer portion generates compressive stress in both outermost layers in a cooling process after firing to improve the flexural strength of the multilayer ceramic substrate.

Patent Document 1: Japanese Unexamined Patent Application Publication No. 2007-73728
Patent Document 2: International Publication No. 2007/142112

SUMMARY OF THE INVENTION

In recent years, the miniaturization of electronic components has required thinner multilayer ceramic substrates. In each of the multilayer ceramic substrates described in Patent Documents 1 and 2, layers each having a lower thermal expansion coefficient than the inner layer portion are disposed at the surface layer portions, thus resulting in improved flexural strength to enable the multilayer ceramic substrate to have a smaller thickness. In each of the multilayer ceramic substrates described in Patent Documents 1 and 2, however, the following was found: The surface layer portions each have an uneven sintered state to generate strain in the surface layer portions, thus forming a crack therein. The penetration of water into the crack can decrease insulation reliability. To provide a thinner multilayer ceramic substrate having increased strength in the future, it is necessary to inhibit the formation of the crack in the surface layer portions.

The present invention has been made to solve the foregoing problems. It is an object of the present, invention to provide a high-strength multilayer ceramic substrate having a surface layer portion in which the formation of a crack is inhibited.

To achieve the foregoing object, a multilayer ceramic substrate of the present invention includes a laminated structure including a surface layer portion located on a surface of the laminated structure and an inner layer portion located on the inner side of the laminated structure, the surface layer portion including a first layer adjacent to the inner layer portion, the inner layer portion including a second layer adjacent to the first layer, in which the thermal expansion coefficient of the first layer is lower than the thermal expansion coefficient of the second layer, a first glass contained in the, first layer and a second glass contained in the second layer each contain 40% or more by weight MO Nthere N represents at least one selected from the group consisting of Ca, Mg, Sr, and Ba), and the difference in softening points between the first glass contained and the second glass is 60° C. or lower.

In the multilayer ceramic substrate of the present invention, the thermal expansion coefficient of the first layer in the surface layer portion is lower than the thermal expansion coefficient of the second layer in the inner layer portion. Thus, as with the case of Patent Document 1 or the like, compressive stress is generated in the surface layer portion in a cooling process after firing, thereby enhancing the flexural strength of the multilayer ceramic substrate.

In the multilayer ceramic substrate of the present invention, furthermore, the difference in softening points between the first glass contained in the first layer and the second glass contained in the second layer is 60° C. or lower. In the case of a large difference in softening points between the first glass contained in the first layer and the second glass contained in the second layer, strain stress is applied to the first layer to form a crack, and the penetration of water into the crack degrades the insulating properties. In particular, in the case of a structure including a via conductor that does not extend to the first layer and that extends continuously to a position close to the first layer, the tendency is noticeable. In contrast, when the difference in softening points between the glass contained in the first layer and the glass contained in the second layer is 60° C. or lower, strain stress applied to the first layer is reduced to inhibit the formation of the crack and the following penetration of water, thus resulting in improved insulation reliability.

The difference in softening points between the glass contained in the first layer and the glass contained in the second layer refers to the absolute value of the difference therebetween. That is, in the multilayer ceramic substrate of the present invention, the difference in softening points between the glass contained in the first layer and the glass contained in the second layer is 0° C. or higher and 60° C. or lower.

In the multilayer ceramic substrate of the present invention, the softening point of the glass contained in each of the first layer and the second layer is preferably 720° C. or higher.

The use of glasses having high softening points as the glass contained in the first layer and the second layer inhibits the diffusion of silver (Ag) and copper (Cu) contained in electrodes into the ceramic substrate, thus reducing the difference, in sintered densities between portions where the electrodes are disposed by application and a portion other than the portions.

In the multilayer ceramic substrate of the present invention, letting the thermal expansion coefficient of the first layer be $\alpha1$ [ppmK$^{-1}$] and letting the thermal expansion coefficient of the second layer be $\alpha2$ [ppmK$^{-1}$], $0.3 \leq \alpha2 - \alpha1 \leq 1.5$ is preferred. Because the difference in thermal expansion coefficients, i.e., $\alpha2 - \alpha1$, is 0.3 or more, the effect of increasing strength is sufficiently provided. Because the difference in thermal expansion coefficients, i.e., $\alpha2 - \alpha1$, is 1.5 or less, an increase in stress at the interface between the first layer and the second layer is inhibited, thus inhibiting the occurrence of delamination at the interfacial portion.

An electronic component of the present invention includes the multilayer ceramic substrate.

According to the present invention, it is possible to provide the high-strength multilayer ceramic substrate having the surface layer portion in which the formation of a crack is inhibited.

DETAILED DESCRIPTION OF THE PREFERRED EMBODIMENTS

A multilayer ceramic substrate and an electronic component of the present invention will be described below.

However, the present invention is not limited to the following structures. Various modifications can be made as long as the gist of the present invention is riot changed. A combination of two or more of individual preferred embodiments of the present invention described below is also included in the present invention.

Figure 1:
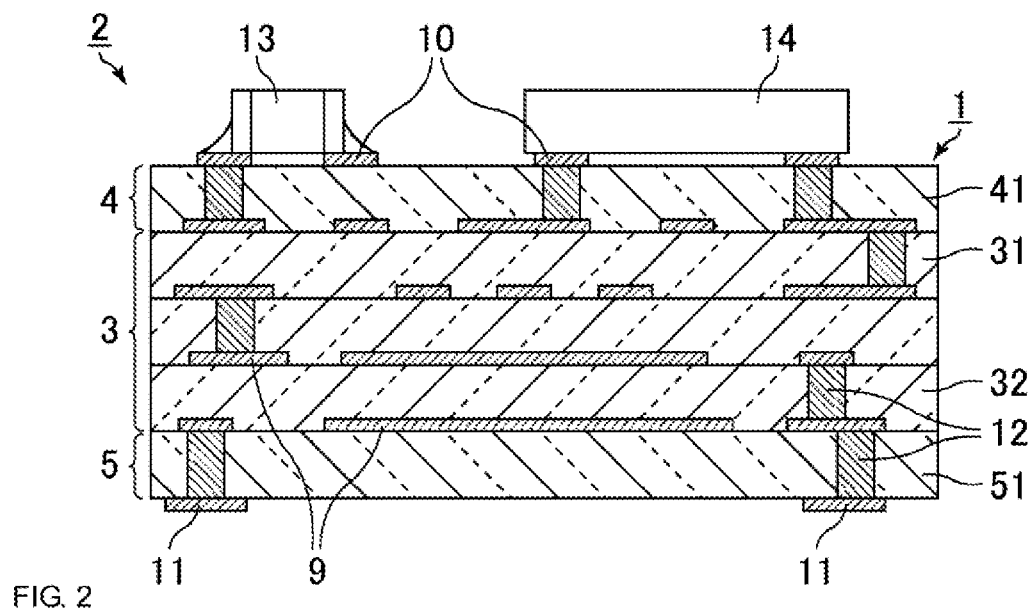
FIG. 1 is a schematic cross-sectional view illustrating an electronic component including a multilayer ceramic substrate according to an embodiment of the present invention.

FIG. 1 is a schematic cross-sectional view illustrating an electronic component including a multilayer ceramic substrate according to an embodiment of the present invention.

A multilayer ceramic substrate 1 has a laminated structure including an inner layer portion 3, a first surface layer portion 4, and a second surface layer portion 5, which sandwich the inner layer portion 3 in the thickness direction.

The inner layer portion 3, the first surface layer portion 4, and the second surface layer portion 5 each include a ceramic layer formed of at least one layer. The first surface layer portion 4 includes a first layer 41 adjacent to the inner layer portion 3. The second surface layer portion 5 includes a first layer 51 adjacent to the inner layer portion 3. The inner layer portion 3 includes a second layer 31 adjacent to the first layer 41 in the first surface layer portion 4, and a second layer 32 adjacent to the first layer 51 in the second surface layer portion 5.

The multilayer ceramic substrate 1 includes conductive leads. The conductive leads serve to form passive devices such as capacitors and inductors or serve to establish wiring connections such as electrical, connections between devices. Typically, as illustrated in the figure, the conductive leads include some conductive films 9, 10, and 11 and some via-hole conductors 12. These conductive leads preferably contain silver or copper as a main component.

The conductive films 9 are disposed inside the multilayer ceramic substrate 1. The conductive films 10 are disposed on one main surface of the multilayer ceramic substrate A, and the conductive films 11 are, disposed on the other main surface of the, multilayer ceramic substrate 1. Each of the via-hole conductors 12 is disposed so as to be electrically connected to any of the conductive films 9, 10, and 11 and so as to penetrate a specific one of the ceramic layers in the thickness direction.

Chip components 13 and 14 are mounted on the one main surface of the multilayer ceramic substrate 1 in a state of being electrically connected to the conductive films 10. Thereby, an electronic component 2 including the multilayer ceramic substrate 1 is provided. The conductive films 11 disposed on the other main surface of the multilayer ceramic substrate 1 are used as electrical connection members for use in mounting the electronic component 2 on a motherboard (not illustrated).

In the multilayer ceramic substrate of the present invention, the thermal expansion coefficient of the first layer is lower than the thermal expansion coefficient of the second layer. Here, letting the thermal expansion coefficient of the first layer be $\alpha1$ [ppmK$^{-1}$] and letting the thermal expansion coefficient of the second layer be $\alpha2$ [ppmK$^{-1}$], $0.3 \leq \alpha2 - \alpha1 \leq 1.5$ is preferred. The lower limit of the difference in thermal expansion coefficients, i.e., $\alpha2 - \alpha1$, is more preferably 0.5, even more preferably 0.6. The upper limit thereof is more preferably 1.4, even more preferably 1.3.

The thermal expansion coefficient is defined as a value measured by thermomechanical analysis (TMA) from room temperature to 500° C. at a rate of temperature increase of 5° C./min.

The lower limit of the thermal expansion coefficient $\alpha1$ of the first layer is preferably 5.0 ppmK$^{-1}$, more preferably 5.5 ppmK$^{-1}$. The upper limit thereof is preferably 8.0 ppmK$^{-1}$, more preferably 7.5 ppmK$^{-1}$, even more preferably 6.5 ppmK$^{-1}$. The lower limit of the thermal expansion coefficient $\alpha2$ of the second layer is preferably 5.5 ppmK$^{-1}$, more preferably 6.0 ppmK$^{-1}$. The upper limit thereof is preferably 8.5 ppmK$^{-1}$, more preferably 8.0 ppmK$^{-1}$.

In the case where a mixture of a ceramic filler and a glass is used as a material for the surface layer portion ceramic Layers included in the surface layer portions and the inner layer portion ceramic layers included in the inner layer portion, the thermal expansion coefficient of the first layer and the thermal expansion coefficient of the second layer can each be adjusted by changing the ratio of the ceramic filler to the glass or the type of ceramic filler and/or glass.

In the multilayer ceramic substrate of the present invention, the difference, in softening points between the glass contained in the first layer and the glass contained in the second layer is 6° C. or lower. The difference in softening points between the glass contained in the first layer and the glass contained in the second layer is preferably 30° C. or lower, more preferably 20° C. or lower, particularly preferably 0° C. That is, the case where the softening point of the glass contained in the first layer is equal to the softening point of the glass contained in the second layer is particularly preferred.

In the case where the softening point of the glass contained in the first layer is different from the softening point of the glass contained in the second layer, the softening point of the glass contained in the first layer is preferably higher than the softening point of the glass contained in the second layer. However, the softening point of the glass contained in the first layer may be lower than the softening point of the glass contained in the second layer. The softening point of the glass contained in the first layer is higher than the softening point of the glass contained in the second layer; thus, the formation of voids in the surface layer portions due to excessive diffusion of an electrode component is inhibited to further improve the reliability of the surface layer portions.

The glass contained in each of the first layer and the second layer preferably has a softening point of 720° C. or higher. When the softening point of the glass contained in the first layer is denoted as Ts1 [° C.], the lower limit of Ts1 is preferably 720° C., and the upper limit thereof is preferably 830° C., more preferably 820° C. When the softening point of the glass contained in the second layer is denoted as Ts2 [° C.], the lower limit of Ts2 is more preferably 730° C., and the upper limit thereof is preferably 840° C., more preferably 830° C.

The softening point of the glass is defined as a value measured by differential thermal analysis at a rate of temperature increase of 10° C./min.

Each of the first layer and the second layer contains glass. In particular, each of the glasses contained in the first layer and the second layer contains 40% or more by weight MO (where M represents at least one selected from the group consisting of Ca, Mg, Sr, and Ba).

Preferably, the glass contained in each of the first layer and the second layer further contains $SiO_2$, $B_2O_3$, and $Al_2O_3$.

The adjustment of the compositions of the glasses and the contents of components thereof contained in each of the first layer and the second layer enables the adjustment of the softening point of the glass contained in the first layer and the softening point of the glass contained in the second layer in addition to the adjustment of the thermal expansion coefficient of the first layer and the thermal expansion coefficient of the second layer.

Preferred contents of components in the glass contained in the first layer are described below.

MO (preferably CaO): 40.0% or more by weight and 55.0% or less by weight, a preferred lower limit of 41.0% by weight, and a preferred upper limit of 50.0% by weight $Al_2O_3$: 0% or more by weight and 10.0% or less by weight, a preferred lower limit of 3.0% by weight, and a preferred upper limit of 8.5% by weight $B_2O_3$: 0% or more by weight and 27.0% or less by weight, a preferred lower limit of 3.0% by weight, and a preferred upper limit of 20.0% by weight $SiO_2$: 25.0% or more by weight and 70.0% or less by weight, a preferred lower limit of 30.0% by weight, and a preferred upper limit of 60.0% by weight Preferred contents of components in the glass contained in the second layer are described below.

MO (preferably CaO): 40.0% or more by weight and 55.0% or less by weight, a preferred lower limit of 41.0% by weight, and preferred upper limit of 50.0% by weight $Al_2O_3$: 0% or more by weight and 10.0% or less by weight, a preferred lower limit of 3.0% by weight, and preferred upper limit of 8.5% by weight $B_2O_3$: 0% or more by weight and 27.0% or less by weight, a preferred lower limit of 3.0% by weight, and preferred upper limit of 20.0% by weight $SiO_2$: 25.0% or more by weight and 70.0% or less by weight, a preferred lower limit of 30.0% by weight, and preferred upper limit of 60.0% by weight The glass contained in each of the first layer and the second layer may contain other impurities. In the case where the impurities are contained, the content of the impurities is less than 5% by weight.

Each of the first layer and the second layer preferably contains $Al_2O_3$ as a ceramic filler. The $Al_2O_3$ filler contributes to an improvement in mechanical strength.

The first layer preferably contains $Al_2O_3$ as a ceramic filler in an amount of 48% or more by weight and 58% or less by weight. The second layer preferably contains $Al_2O_3$ as a ceramic filler in an amount of 50% or more by weight and 60% or less by weight.

Another ceramic material such as $ZrO_2$ other than $Al_2O_3$ may be used as a ceramic filler.

In the case where the surface layer portions include a layer other than the first layer, although the layer other than the first layer may be composed of a material different from that of the first layer, the layer is preferably composed of the same material as that of the first layer. In the case where the inner layer portion includes a layer other than the second layer, although the layer other than the second layer may be composed of a material different from that of the second layer, the layer is preferably composed of the same material as that of the second layer.

The multilayer ceramic substrate 1 illustrated in FIG. 1 is preferably produced as described below.

Figure 2:
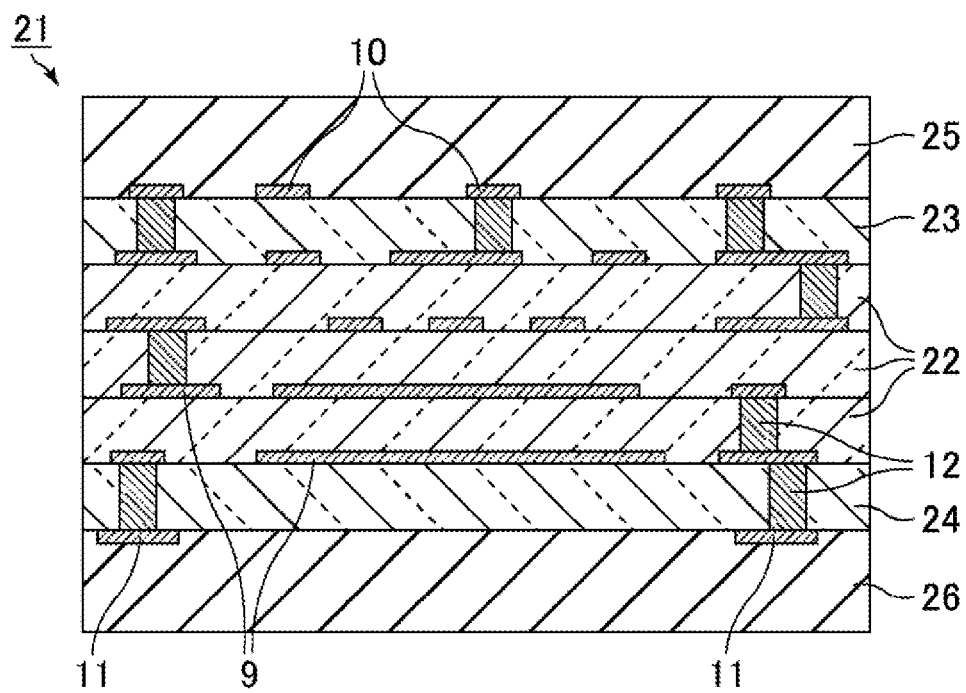
FIG. 2 is a cross-sectional view illustrating a composite multilayer body produced in the course of the production of the multilayer ceramic substrate illustrated in FIG. 1.

FIG. 2 is a cross-sectional view illustrating a composite multilayer body produced in the course of the production of the multilayer ceramic substrate illustrated in FIG. 1.

A composite multilayer body 21 include inner layer ceramic green sheets 22 to be formed into the inner layer portion of the multilayer ceramic substrate 1, surface layer ceramic green sheets 23 and 24 to be formed into the surface layer portions, and constraining ceramic green sheets 25 and 26. The conductive films 9, 10, and 11 and the via-hole conductors 12 are disposed as conductive leads included in the multilayer ceramic substrate 1 in relation to the inner layer ceramic green sheets 22 and the surface layer ceramic green sheets 23 and 24.

To produce the composite multilayer body 21, the inner layer ceramic green sheets 22, the surface layer ceramic green sheets 23 and 24, and the constraining ceramic green sheets 25 and 26 are provided. The composition of each of the green sheets 22, 23, and 24 is selected in such a manner that the thermal expansion coefficient of the sintered body of each of the surface layer ceramic green sheets 23 and 24 to be formed into the first layers is lower than the thermal expansion coefficient of the sintered body of each of the inner layer ceramic green sheets 22 to be formed into the second layers, a material of the sintered body of each of the surface layer ceramic green sheets 23 and 24 to be formed into the first layers and a material of the sintered body of each of the inner layer ceramic green sheets 22 to be formed into the second layers each contain a glass containing 40% or more by weight MO (where M represents at least one selected from the group consisting of Ca, Mg, Sr, and Ba), and the difference in softening points of the glass between the sintered body of each of the surface layer ceramic green sheets 23 and 24 to be formed into the first layers and the sintered body of each of the inner layer ceramic green sheets 22 to be formed into the second layers is 60° C. or lower. Each of the constraining ceramic green sheets 25 and 26 has a composition containing an inorganic material that is not sintered at a temperature at which the surface layer ceramic green sheets 23 and 24 and the inner layer ceramic green sheets 22 are sintered.

Next, the surface layer ceramic green sheets 23 and 24 are arranged so as to sandwich at least one of the inner layer ceramic green sheets 22 in the laminating direction. Furthermore, the constraining ceramic green sheets 25 and 26 are arranged at outer side portions thereof. Thereby, the composite multilayer body 21 as illustrated in FIG. 2 is produced.

Subsequently, the composite multilayer body 21 is fired at a temperature at which the surface layer ceramic green sheets 23 and 24 and the inner layer ceramic green sheets 22 are sintered and at which the constraining ceramic green sheets 25 and 26 are not sintered, thereby producing the fired composite multilayer body 21 in which the thermal expansion coefficient of each of the first layers 41 and 51 (see FIG. 1) derived from the surface layer ceramic green sheets 23 and 24 is lower than the thermal expansion coefficient of each of the second layers 31 and 32 (see FIG. 1) derived from the inner layer ceramic green sheets 22, the materials of the first layers 41 and 51 and the second layers 31 and 32 (see FIG. 1) each contain the glass containing 40% or more by weight MO (where M represents at least one selected from the group consisting of Ca, Mg, Sr, and Ba), and the difference in softening points between the glass contained in each of the first layers 41 and 51 and the glass contained in each of the second layers 31 and 32 is 60° C. or lower.

Then portions of the sintered composite multilayer body 21 derived from the constraining ceramic green sheets 25 and 26 are removed, thereby providing the multilayer ceramic substrate 1.

In the foregoing production method, because the composite multilayer body including the constraining ceramic green sheets arranged on both surfaces thereof is fired, the shrinkage of the surface layer ceramic green sheets and the inner layer ceramic green sheets in the respective main surface directions is inhibited during firing. Consequently, undesired deformation of the multilayer ceramic substrate is inhibited to result in increased dimensional accuracy. In addition, the delamination between the surface layer portions and the inner layer portion during firing does not easily occur.

In the case of producing the multilayer ceramic substrate 1, instead of using the constraining ceramic green sheets 25 or 26 as described above, a multilayer body free from a constraining ceramic green sheet may be fired.

EXAMPLES

Examples that specifically disclose a multilayer ceramic substrate of the present invention will be described below. The present invention is not limited to these examples.

(Production of Multilayer Ceramic Substrate)

Glass powders having compositions and softening points presented in Table 1 were provided.

The softening points of the glass powders were measured with a differential thermal analyzer (available from Rigaku Corporation) at a rate of temperature increase of 10 ° C/min.

TABLE 1

| Glass symbol | CaO [% by weight] | $Al_2O_3$ [% by weight] | $B_2O_3$ [% by weight] | $SiO_2$ [% by weight] | softening point [° C.] |
|---|---|---|---|---|---|
| G1 | 45 | 7 | 6 | 42 | 800 |
| G2 | 47 | 4 | 11 | 38 | 740 |
| G3 | 50 | 3 | 14 | 33 | 730 |

To obtain samples presented in Table 2, surface layer ceramic green sheets and inner layer ceramic green sheets were produced.

Table 2 lists the types and contents of the glass powders, the average particle sizes $D_{50}$ and contents of $Al_2O_3$ powders serving as ceramic fillers, and the contents of a $CaSiO_3$ powder serving as seed crystals contained in the surface layer ceramic green sheets and the inner layer ceramic green sheets.

In Table 2, the symbols of "G1" to "G3" described in the section "Type" of "Glass" correspond to those in "Glass symbol" in Table 1.

The average, particle size $D_{50}$ of the $Al_2O_3$ powders was determined by measuring a particle size distribution in the range of 0.02 μm or more and 1,400 μm or less with a particle size distribution analyzer MT3300-EX, available from Microtrac BEL, using a laser diffraction/scatterng method and calculating the number-average particle size.

TABLE 2

| | First layer (surface layer) | | | | | | Second layer (inner layer) | | | | | |
|---|---|---|---|---|---|---|---|---|---|---|---|---|
| | | Glass | Ceramic filler | | Seed crystal | | | Glass | Ceramic filler | | Seed crystal | |
| | Type | Content [parts by weight] | $D_{50}$ [μm] | Content [parts by weight] | Content [parts by weight] | Thickness [μm] | Type | Content [parts by weight] | $D_{50}$ [μm] | Content [parts by weight] | Content [parts by weight] | Thickness [μm] |
| Example 1 | G1 | 48 | 1.0 | 52 | 0.05 | 12.0 | G1 | 50 | 1.0 | 50 | 0.05 | 25.0 |
| Example 2 | G1 | 48 | 1.0 | 52 | 0.05 | 12.0 | G1 | 50 | 1.0 | 50 | 0.05 | 15.0 |
| Example 3 | G1 | 48 | 0.4 | 52 | 0.05 | 12.0 | G1 | 50 | 1.0 | 50 | 0.05 | 13.0 |
| Example 4 | G1 | 48 | 1.5 | 52 | 0.05 | 12.0 | G1 | 50 | 1.0 | 50 | 0.05 | 13.0 |
| Example 5 | G1 | 48 | 1.0 | 52 | 0.10 | 12.0 | G1 | 50 | 1.0 | 50 | 0.05 | 13.0 |
| Example 6 | G1 | 48 | 1.0 | 52 | 0.05 | 12.0 | G1 | 50 | 1.0 | 50 | 0.05 | 13.0 |
| Example 7 | G1 | 48 | 1.0 | 52 | 0.05 | 12.0 | G1 | 50 | 0.4 | 50 | 0.05 | 13.0 |
| Example 8 | G1 | 48 | 1.0 | 52 | 0.05 | 12.0 | G1 | 50 | 1.5 | 50 | 0.05 | 13.0 |
| Example 9 | G1 | 48 | 1.0 | 52 | 0.05 | 12.0 | G1 | 50 | 1.0 | 50 | 0.10 | 13.0 |
| Example 10 | G1 | 48 | 1.0 | 52 | 0.05 | 10.0 | G1 | 50 | 1.0 | 50 | 0.05 | 13.0 |
| Example 11 | G1 | 48 | 1.0 | 52 | 0.05 | 12.0 | G1 | 50 | 1.0 | 50 | 0.05 | 12.0 |
| Example 12 | G1 | 48 | 1.0 | 52 | 0.05 | 12.0 | G2 | 60 | 1.0 | 40 | 0.05 | 25.0 |
| Example 13 | G1 | 48 | 1.0 | 52 | 0.05 | 12.0 | G2 | 60 | 1.0 | 40 | 0.05 | 25.0 |

TABLE 2-continued

| | First layer (surface layer) | | | | | | Second layer (inner layer) | | | | | |
|---|---|---|---|---|---|---|---|---|---|---|---|---|
| | | Glass | Ceramic filler | | Seed crystal | | | Glass | Ceramic filler | | Seed crystal | |
| | Type | Content [parts by weight] | $D_{50}$ [μm] | Content [parts by weight] | Content [parts by weight] | Thickness [μm] | Type | Content [parts by weight] | $D_{50}$ [μm] | Content [parts by weight] | Content [parts by weight] | Thickness [μm] |
| Example 14 | G1 | 48 | 0.4 | 52 | 0.05 | 12.0 | G2 | 60 | 1.0 | 40 | 0.05 | 13.0 |
| Example 15 | G1 | 48 | 1.5 | 52 | 0.05 | 12.0 | G2 | 60 | 1.0 | 40 | 0.05 | 13.0 |
| Example 16 | G1 | 48 | 1.0 | 52 | 0.10 | 12.0 | G2 | 60 | 1.0 | 40 | 0.05 | 13.0 |
| Example 17 | G1 | 48 | 1.0 | 52 | 0.05 | 12.0 | G2 | 60 | 1.0 | 40 | 0.05 | 13.0 |
| Example 18 | G1 | 48 | 1.0 | 52 | 0.05 | 12.0 | G2 | 60 | 0.4 | 40 | 0.05 | 13.0 |
| Example 19 | G1 | 48 | 1.0 | 52 | 0.05 | 12.0 | G2 | 60 | 1.5 | 40 | 0.05 | 13.0 |
| Example 20 | G1 | 48 | 1.0 | 52 | 0.05 | 12.0 | G2 | 60 | 1.0 | 40 | 0.10 | 13.0 |
| Example 21 | G1 | 48 | 1.0 | 52 | 0.05 | 10.0 | G2 | 60 | 1.0 | 40 | 0.05 | 13.0 |
| Example 22 | G1 | 48 | 1.0 | 52 | 0.05 | 12.0 | G2 | 60 | 1.0 | 40 | 0.05 | 12.0 |
| Example 23 | G2 | 50 | 1.0 | 50 | 0.05 | 12.0 | G1 | 52 | 1.0 | 48 | 0.05 | 13.0 |
| Example 24 | G2 | 50 | 1.0 | 50 | 0.05 | 12.0 | G3 | 60 | 1.0 | 40 | 0.05 | 13.0 |
| Example 25 | G3 | 50 | 1.0 | 50 | 0.05 | 12.0 | G2 | 52 | 1.0 | 48 | 0.05 | 13.0 |
| Example 26 | G1 | 52 | 1.0 | 48 | 0.05 | 12.0 | G2 | 54 | 1.0 | 46 | 0.05 | 13.0 |
| Example 27 | G1 | 48 | 1.0 | 52 | 0.05 | 12.0 | G2 | 54 | 1.0 | 46 | 0.05 | 13.0 |
| Comparative example 1 | G1 | 48 | 1.0 | 52 | 0.05 | 12.0 | G3 | 52 | 1.0 | 48 | 0.05 | 13.0 |
| Comparative example 2 | G3 | 52 | 1.0 | 48 | 0.05 | 12.0 | G1 | 48 | 1.0 | 52 | 0.05 | 13.0 |
| Comparative example 3 | G1 | 50 | 1.0 | 50 | 0.10 | 13.0 | G1 | 48 | 1.0 | 52 | 0.05 | 12.0 |

To obtain the samples listed in Table 2, a solvent, a dispersant, a binder, and a plasticizer were added to and mixed with powder mixtures each containing the glass powder, the $Al_2O_3$ powder, and the $CaSiO_3$ powder to prepare slurries. The resulting slurries were applied to PET films to produce the surface layer ceramic green sheets and the inner layer ceramic green sheets. As listed in Table 2, the ratios of the glass powders to the $Al_2O_3$ powders were adjusted to 48:52 to 60:40.

A solvent, a dispersant, a binder, and a plasticizer were added to and mixed with the $Al_2O_3$ powder to prepare a slurry. The slurry was applied to PET films to produce constraining ceramic green sheets each having a thickness of 50 μm.

In the foregoing process, the thicknesses of the surface layer ceramic green sheets and the inner layer ceramic green sheets were adjusted in such a manner that the thicknesses of the first layers (surface layers) and the thicknesses of the second layers (inner layers) listed in Table 2 were obtained after firing.

Multilayer ceramic substrates for evaluation were produced with the surface layer ceramic green sheets and the inner layer ceramic green sheets.

Figure 3:
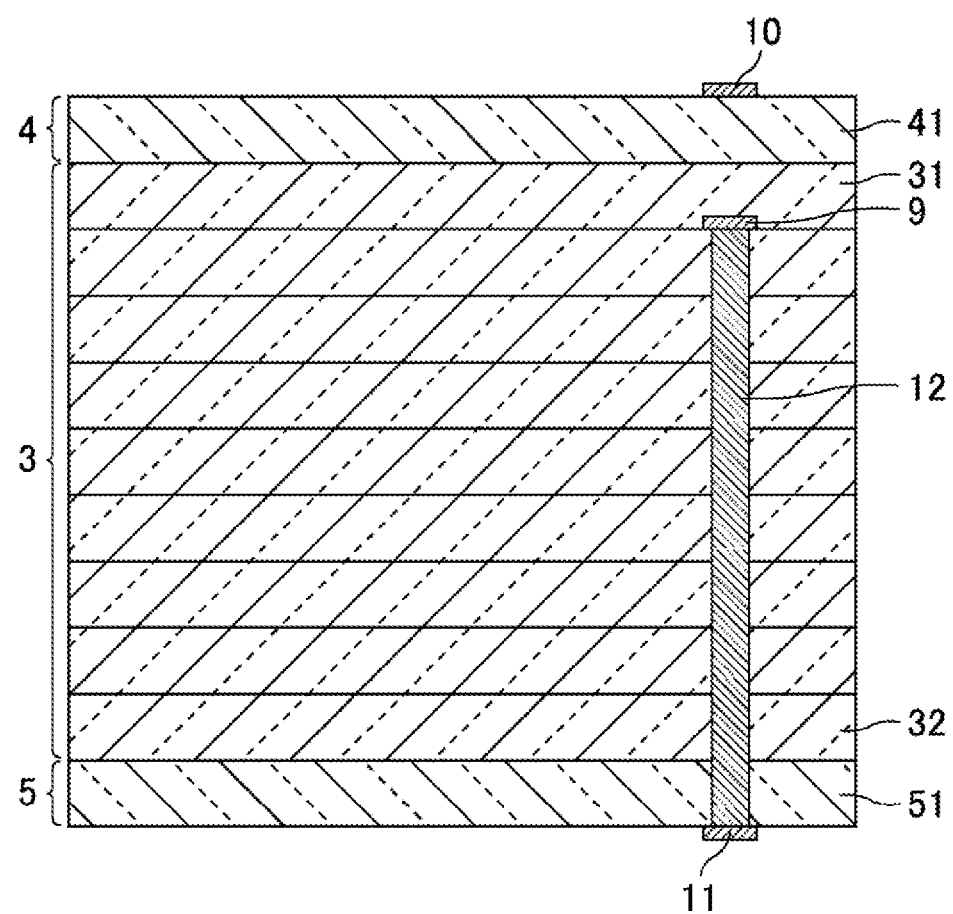
FIG. 3 is a schematic cross-sectional view illustrating a multilayer ceramic substrate for evaluation.

FIG. 3 was a schematic cross-sectional view of a multilayer ceramic substrate for evaluation.

Each of the multilayer ceramic substrates for evaluation has a laminated structure in which the inner layer portion 3 serves as a core and in which the surface layer portions 4 and 5 (the first layers 41 and 51) are bonded to both the respective surfaces of the inner layer portion 3 (the second layers 31 and 32). The via-hole conductor 12 is provided in the substrate. The via-hole conductor 12 is connected to the conductive film 11 disposed on a surface of the first layer 51 of the substrate and to the conductive film 9 disposed at a position between layers in the inner layer portion 3. The conductive film 10 disposed on a surface of the first layer 41 of the substrate is spaced apart from the conductive film 9 connected to the via-hole conductor 12 by a predetermined distance (spacing corresponding to the total thickness of the first layer 41 and the second layer 31).

Specifically, the via-hole conductor and the conductive films for interlayer connections were formed by printing in or on the surface layer ceramic green sheets and the inner layer ceramic green sheets. The ceramic green sheets were subjected to stacking and pressure bonding. The resulting green body was fired at 870° C. for a holding time of 10 minutes. Unsintered portions derived from the constraining ceramic green sheets were removed to provide a multilayer ceramic substrate for evaluation.

TABLE 3

| | Softening point [° C.] | | | Thermal expansion coefficient [ppmK$^{-1}$] | | | Thickness [μm] | | |
|---|---|---|---|---|---|---|---|---|---|
| | First layer (Ts1) | Second layer (Ts2) | Absolute value of difference |Ts1 − Ts2| | First layer (α1) | Second layer (α2) | Difference α2 − α1 | First layer | Second layer | Total |
| Example 1 | 800 | 800 | 0 | 6.0 | 6.3 | 0.3 | 12.0 | 25.0 | 37.0 |
| Example 2 | 800 | 800 | 0 | 6.0 | 6.3 | 0.3 | 12.0 | 15.0 | 27.0 |
| Example 3 | 800 | 800 | 0 | 6.0 | 6.3 | 0.3 | 12.0 | 13.0 | 25.0 |
| Example 4 | 800 | 800 | 0 | 6.0 | 6.3 | 0.3 | 12.0 | 13.0 | 25.0 |
| Example 5 | 800 | 800 | 0 | 6.0 | 6.3 | 0.3 | 12.0 | 13.0 | 25.0 |
| Example 6 | 800 | 800 | 0 | 6.0 | 6.3 | 0.3 | 12.0 | 13.0 | 25.0 |
| Example 7 | 800 | 800 | 0 | 6.0 | 6.3 | 0.3 | 12.0 | 13.0 | 25.0 |
| Example 8 | 800 | 800 | 0 | 6.0 | 6.3 | 0.3 | 12.0 | 13.0 | 25.0 |
| Example 9 | 800 | 800 | 0 | 6.0 | 6.3 | 0.3 | 12.0 | 13.0 | 25.0 |

TABLE 3-continued

| | | | | | | | | | |
|---|---|---|---|---|---|---|---|---|---|
| Example 10 | 800 | 800 | 0 | 6.0 | 6.3 | 0.3 | 10.0 | 13.0 | 23.0 |
| Example 11 | 800 | 800 | 0 | 6.0 | 6.3 | 0.3 | 12.0 | 12.0 | 24.0 |
| Example 12 | 800 | 740 | 60 | 6.0 | 7.5 | 1.5 | 12.0 | 25.0 | 37.0 |
| Example 13 | 800 | 740 | 60 | 6.0 | 7.5 | 1.5 | 12.0 | 25.0 | 37.0 |
| Example 14 | 800 | 740 | 60 | 6.0 | 7.5 | 1.5 | 12.0 | 13.0 | 25.0 |
| Example 15 | 800 | 740 | 60 | 6.0 | 7.5 | 1.5 | 12.0 | 13.0 | 25.0 |
| Example 16 | 800 | 740 | 60 | 6.0 | 7.5 | 1.5 | 12.0 | 13.0 | 25.0 |
| Example 17 | 800 | 740 | 60 | 6.0 | 7.5 | 1.5 | 12.0 | 13.0 | 25.0 |
| Example 18 | 800 | 740 | 60 | 6.0 | 7.5 | 1.5 | 12.0 | 13.0 | 25.0 |
| Example 19 | 800 | 740 | 60 | 6.0 | 7.5 | 1.5 | 12.0 | 13.0 | 25.0 |
| Example 20 | 800 | 740 | 60 | 6.0 | 7.5 | 1.5 | 12.0 | 13.0 | 25.0 |
| Example 21 | 800 | 740 | 60 | 6.0 | 7.5 | 1.5 | 10.0 | 13.0 | 23.0 |
| Example 22 | 800 | 740 | 60 | 6.0 | 7.5 | 1.5 | 12.0 | 12.0 | 24.0 |
| Example 23 | 740 | 800 | 60 | 6.0 | 7.4 | 1.4 | 12.0 | 13.0 | 25.0 |
| Example 24 | 740 | 730 | 10 | 6.0 | 7.5 | 1.5 | 12.0 | 13.0 | 25.0 |
| Example 25 | 730 | 740 | 10 | 5.9 | 7.4 | 1.5 | 12.0 | 13.0 | 25.0 |
| Example 26 | 800 | 740 | 60 | 7.4 | 7.6 | 0.2 | 12.0 | 13.0 | 25.0 |
| Example 27 | 800 | 740 | 60 | 6.0 | 7.6 | 1.6 | 12.0 | 13.0 | 25.0 |
| Comparative example 1 | 800 | 730 | 70 | 6.0 | 6.3 | 0.3 | 12.0 | 13.0 | 25.0 |
| Comparative example 2 | 730 | 800 | 70 | 6.3 | 6.0 | −0.3 | 12.0 | 13.0 | 25.0 |
| Comparative example 3 | 800 | 800 | 0 | 6.3 | 6.0 | −0.3 | 13.0 | 12.0 | 25.0 |

| | | Flexural strength [MPa] | | | | |
|---|---|---|---|---|---|---|
| | Microcrack | Surface layer portion | Inner layer portion | Substrate | Insulation LogIR [Ω] | Delamination |
| Example 1 | ○ | 355 | 350 | 405 | 11 | ⊙ |
| Example 2 | ○ | 355 | 350 | 405 | 11 | ⊙ |
| Example 3 | ○ | 355 | 350 | 405 | 11 | ⊙ |
| Example 4 | ○ | 355 | 350 | 405 | 11 | ⊙ |
| Example 5 | ○ | 355 | 350 | 405 | 11 | ⊙ |
| Example 6 | ○ | 355 | 350 | 405 | 11 | ⊙ |
| Example 7 | ○ | 355 | 350 | 415 | 11 | ⊙ |
| Example 8 | ○ | 355 | 350 | 405 | 11 | ⊙ |
| Example 9 | ○ | 355 | 350 | 410 | 11 | ⊙ |
| Example 10 | ○ | 355 | 350 | 405 | 7 | ⊙ |
| Example 11 | ○ | 355 | 350 | 405 | 7 | ⊙ |
| Example 12 | ○ | 355 | 310 | 395 | 11 | ⊙ |
| Example 13 | ○ | 355 | 310 | 395 | 11 | ⊙ |
| Example 14 | ○ | 355 | 310 | 395 | 11 | ⊙ |
| Example 15 | ○ | 355 | 310 | 395 | 11 | ⊙ |
| Example 16 | ○ | 355 | 310 | 395 | 11 | ⊙ |
| Example 17 | ○ | 355 | 310 | 395 | 11 | ⊙ |
| Example 18 | ○ | 355 | 310 | 395 | 11 | ⊙ |
| Example 19 | ○ | 355 | 310 | 395 | 11 | ⊙ |
| Example 20 | ○ | 355 | 310 | 395 | 11 | ⊙ |
| Example 21 | ○ | 355 | 310 | 395 | 7 | ⊙ |
| Example 22 | ○ | 355 | 310 | 395 | 7 | ⊙ |
| Example 23 | ○ | 350 | 340 | 400 | 11 | ⊙ |
| Example 24 | ○ | 350 | 310 | 380 | 11 | ⊙ |
| Example 25 | ○ | 350 | 340 | 390 | 11 | ⊙ |
| Example 26 | ○ | 355 | 330 | 330 | 11 | ⊙ |
| Example 27 | ○ | 340 | 330 | 380 | 11 | ○ |
| Comparative example 1 | X | 340 | 340 | 380 | 7 | ⊙ |
| Comparative example 2 | X | 340 | 340 | 330 | 7 | ⊙ |
| Comparative example 3 | ○ | 355 | 355 | 340 | 11 | ⊙ |

(Evaluation of Multilayer Ceramic Substrate)

Evaluations of "Absolute value of difference in softening point", "Difference in thermal expansion coefficient", "Total thickness of first layer and second layer", "Microcrack", "Flexural strength", "Insulation (interlayer insulation)", and "Delamination" as presented in Table 3 were performed on the multilayer ceramic substrates for evaluation.

"Absolute value of difference in softening point" was determined from the, softening point Ts1 of the glass contained in the first layer and the softening point Ts2 of the lass contained in the second layer of each of the multilayer ceramic substrates for evaluation.

"Difference in thermal expansion coefficient" was determined from the thermal expansion coefficient α1 of the first layer and the thermal expansion coefficient α2 of the second layer of each of the multilayer ceramic substrates for evaluation.

The thermal expansion coefficient was measured by thermomechanical (TMA) from room temperature to 500° C. at a rate of temperature increase of 5° C./min under conditions below.

Measurement atmosphere: nitrogen (300 mL/min)

Measurement load: 10 gf

"Total thickness of first layer and second layer" was determined from the thickness of the first layer and the thickness of the second layer.

"Microcrack" was evaluated by impregnating the substrates with a fluorescent liquid and observing the emission of light from the fluorescent liquid near the first layer with a microscope. The case where no emission of light, having a crack shape was observed at a magnification of ×500 was evaluated as "O". The case where the emission of light having a crack shape was observed at a magnification of ×500 was evaluated as "x".

"Flexural strength" of each of the, surface layer portions, the inner layer portions, and the substrates (the whole of each sintered body) was measured by a three-point bending method.

"Insulation" was evaluated by measuring insulation resistance IR 60 seconds after the application of a direct-current voltage of 30 V. Samples in which Log IR<10 were evaluated as short-circuit failure. The effect of the total thickness of the first layer 41 and the second layer 31 on the insulation in FIG. 3 is evaluated.

"Delamination" was evaluated by visually checking samples for delamination. Among 100 samples, the case where the number of samples delaminated was zero was evaluated as "⊙", the case where the number of samples delaminated was 1 or more and 10 or less was evaluated as "O", and the case where the number of samples delaminated was 11 or more was evaluated as "x".

Table 3 indicates that in each of Examples 1 to 27, in which the difference in softening points between the glass contained in the first layer and glass contained in the second layer is 60° C. or lower and the thermal expansion coefficient of the first layer is lower than the thermal expansion coefficient of the second layer, no microcrack is formed, and the flexural strength of the substrate is equal to or higher than the flexural strength of the, inner layer portion.

In particular, in each of Examples 1 to 25, in which the difference in thermal expansion coefficients is $0.3 \leq \alpha2-\alpha1 \leq 1.5$, the flexural strength of the substrate is higher than the flexural strength of the inner layer portion, and no delamination occurs.

In Examples 1 to 9, 12 to 20, and 23 to 27, in which the total thickness of the first layer and the second layer is 25 μm or more, Log IR≥10, which indicates that good insulation is provided.

In contrast, in each of Comparative examples 1 and 2, in which the difference in softening points between the glass contained in the first layer and the glass contained in the second layer is higher than 60° C., a microcrack is formed, and Log IR<10. This seems to be because the application of strain stress to the surface layer portions forms a microcrack to decrease the insulation.

In Comparative example 2, because the thermal expansion coefficient of the first layer is higher than the thermal expansion coefficient of the second layer, no compressive stress is generated in the surface layer portion. Thereby, the flexural strength of the substrate is lower than the flexural strength of the inner layer portion.

In Comparative example 3, because the difference in softening points between the glass contained in the first layer and the glass contained in the second layer is 60° C. or lower, no microcrack is formed; however, because the thermal expansion coefficient of the first layer is higher than the thermal expansion coefficient of the second layer, the flexural strength of the substrate is lower than the flexural strength of the inner layer portion.

REFERENCE SIGNS LIST 1 multilayer ceramic substrate
2 electronic component
3 inner layer portion
4, 5 surface layer portion
21 composite multilayer body
22 inner layer ceramic green sheet
23, 24 surface layer ceramic green sheet
25, 26 constraining ceramic green sheet
31, 32 second layer
41, 51 first layer

The invention claimed is:

1. A multilayer ceramic substrate comprising:
a laminated structure including a surface layer portion located on a surface of the laminated structure and an inner layer portion located on an inner side of the laminated structure, the surface layer portion including a first layer adjacent to the inner layer portion, the inner layer portion including a second layer adjacent to the first layer,
wherein a first thermal expansion coefficient of the first layer is lower than a second thermal expansion coefficient of the second layer,
the first layer contains a first glass and the second layer contains a second glass, each of the first glass and the second glass containing 40% or more by weight of MO, where M represents at least one selected from Ca, Mg, Sr, and Ba, and
a difference between a first softening point of the first glass and a second softening point of the second glass is 60° C. or lower.

2. The multilayer ceramic substrate according to claim 1, wherein the first softening point of the first glass and the second softening point of the second glass are each 720° C. or higher.

3. The multilayer ceramic substrate according to claim 2, wherein, when the first thermal expansion coefficient of the first layer is $\alpha1$ [ppmK$^{-1}$] and the second thermal expansion coefficient of the second layer is $\alpha2$ [ppmK$^{-1}$], $0.3 \leq \alpha2-\alpha1 \leq 1.5$.

4. The multilayer ceramic substrate according to claim 3, wherein $0.5 \leq \alpha2-\alpha1 \leq 1.4$.

5. The multilayer ceramic substrate according to claim 3, wherein $0.6 \leq \alpha2-\alpha1 \leq 1.3$.

6. The multilayer ceramic substrate according to claim 3, wherein $\alpha1$ is 5.0 ppmk$^{-1}$ to 8.0 ppmK$^{-1}$, and $\alpha2$ is preferably 5.5 ppmk$^{-1}$ to 8.5 ppmK$^{-1}$.

7. The multilayer ceramic substrate according to claim 1, wherein, when the first thermal expansion coefficient of the first layer is $\alpha1$ [ppmK$^{-1}$] and the second thermal expansion coefficient of the second layer is $\alpha2$ [ppmK$^{-1}$], $0.3 \leq \alpha2-\alpha1 \leq 1.5$.

8. The multilayer ceramic substrate according to claim 7, wherein $0.5 \leq \alpha2-\alpha1 \leq 1.4$.

9. The multilayer ceramic substrate according to claim 7, wherein $0.6 \leq \alpha2-\alpha1 \leq 1.3$.

10. The multilayer ceramic substrate according to claim 7, wherein $\alpha1$ is 5.0 ppmk$^{-1}$ 8.0 ppmk$^{-1}$, and $\alpha2$ is preferably 5.5 ppmk$^{-1}$ to 8.5 ppmK$^{-1}$.

11. The multilayer ceramic substrate according to claim 1, wherein the difference between the first softening point of the first glass and the second softening point of the second glass is 30° C. or lower.

12. The multilayer ceramic substrate according to claim 1, wherein the difference between the first softening point of the first glass and the second softening point of the second glass is 20° C. or lower.

13. The multilayer ceramic substrate according to claim 1, wherein the difference between the first softening point of the first glass and the second softening point of the second glass is 0° C.

14. The multilayer ceramic substrate according to claim 1, wherein the first glass and the second glass each further contain $SiO_2$, $B_2O_3$, and $Al_2O_3$.

15. The multilayer ceramic substrate according to claim 14, wherein each of the first glass and the second glass contains 40.0% to 55.0% by weight of MO, 0% to 10.0% by weight of $Al_2O_3$, 0% to 27.0% by weight of $B_2O_3$, and 25.0% to 70.0% by weight of $SiO_2$.

16. The multilayer ceramic substrate according to claim 15, wherein each of the first glass and the second glass contains 41.0% to 50.0% by weight of MO, 3.0% to 8.5% by weight of $Al_2O_3$, 3.0% to 20.0% by weight of $B_2O_3$, and 30.0% to 60.0% by weight of $SiO_2$.

17. An electronic component comprising the multilayer ceramic substrate according to claim 1.

* * * * *